United States Patent
Kita

(10) Patent No.: US 8,004,853 B2
(45) Date of Patent: Aug. 23, 2011

(54) ELECTRICAL JUNCTION BOX

(75) Inventor: Yukinori Kita, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/648,387

(22) Filed: Dec. 29, 2009

(65) Prior Publication Data
US 2010/0202120 A1 Aug. 12, 2010

(51) Int. Cl.
*H01R 9/00* (2006.01)
(52) U.S. Cl. .................................. 361/775; 361/777
(58) Field of Classification Search .................. 361/752, 361/774–778; 439/76.1, 76.2, 949
See application file for complete search history.

(56) References Cited

U.S. PATENT DOCUMENTS

| | | | |
|---|---|---|---|
| 6,851,185 B2 * | 2/2005 | Sumida et al. | 29/847 |
| 7,320,608 B2 * | 1/2008 | Kubota et al. | 439/76.1 |
| 7,713,070 B2 * | 5/2010 | Sasaki et al. | 439/76.1 |
| 7,775,807 B2 * | 8/2010 | Yamaguchi et al. | 439/76.2 |
| 2006/0040526 A1 | 2/2006 | Shirota | |
| 2006/0067058 A1 | 3/2006 | Kita | |
| 2006/0141824 A1 | 6/2006 | Kubota et al. | |

FOREIGN PATENT DOCUMENTS

| | | |
|---|---|---|
| JP | 2006-187052 | 7/2006 |
| JP | 2007-43810 | 2/2007 |

\* cited by examiner

*Primary Examiner* — Hung S Bui
(74) *Attorney, Agent, or Firm* — Greenblum & Bernstein P.L.C.

(57) ABSTRACT

In the case where a printed board is contained in a casing of an electrical junction box, and where electrical components such as relays disposed on the printed board are connected to a bus bar disposed in the casing, a heat generated in the bus bar is uniformed in the casing without causing an uneven heat distribution around the bus bar, thereby requiring no means for radiating the bus bar. An electrical junction box including a casing, a printed board contained in the casing, an insulation plate disposed on the printed board, a bus bar mounted on the insulation plate, and a relay mounted on the printed board. The bus bar is provided with an electrical power source terminal to be connected to an electrical power source side. Branched portions provided on the bus bar are connected to a conductor on the printed board, respectively. A terminal of the relay is connected to the printed board conductor connected to the branched portions of the bus bar. The relay terminal is connected through the printed board conductor to the bus bar.

3 Claims, 5 Drawing Sheets

[Fig. 4]
(A)
(B)
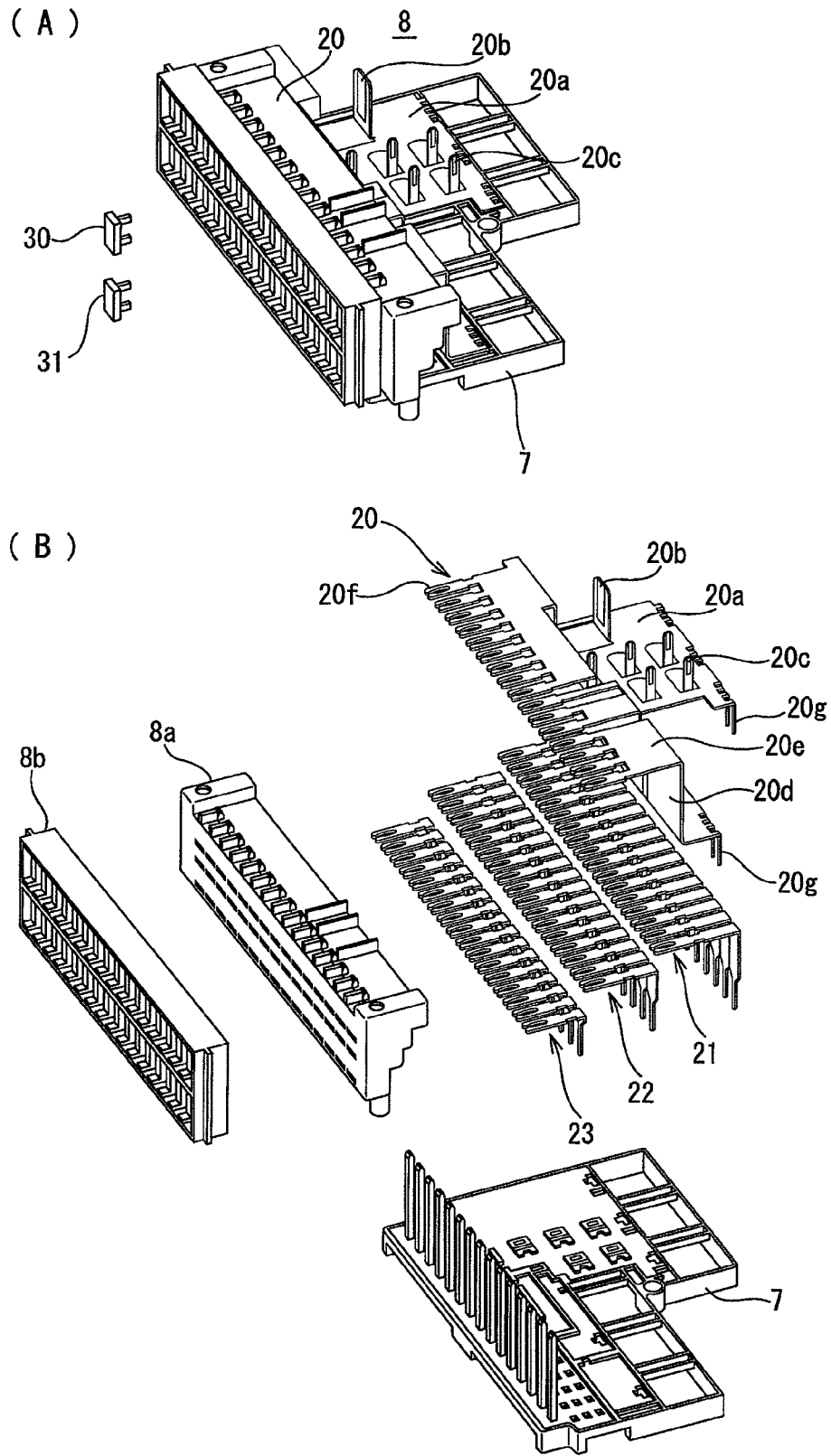

[Fig. 5]
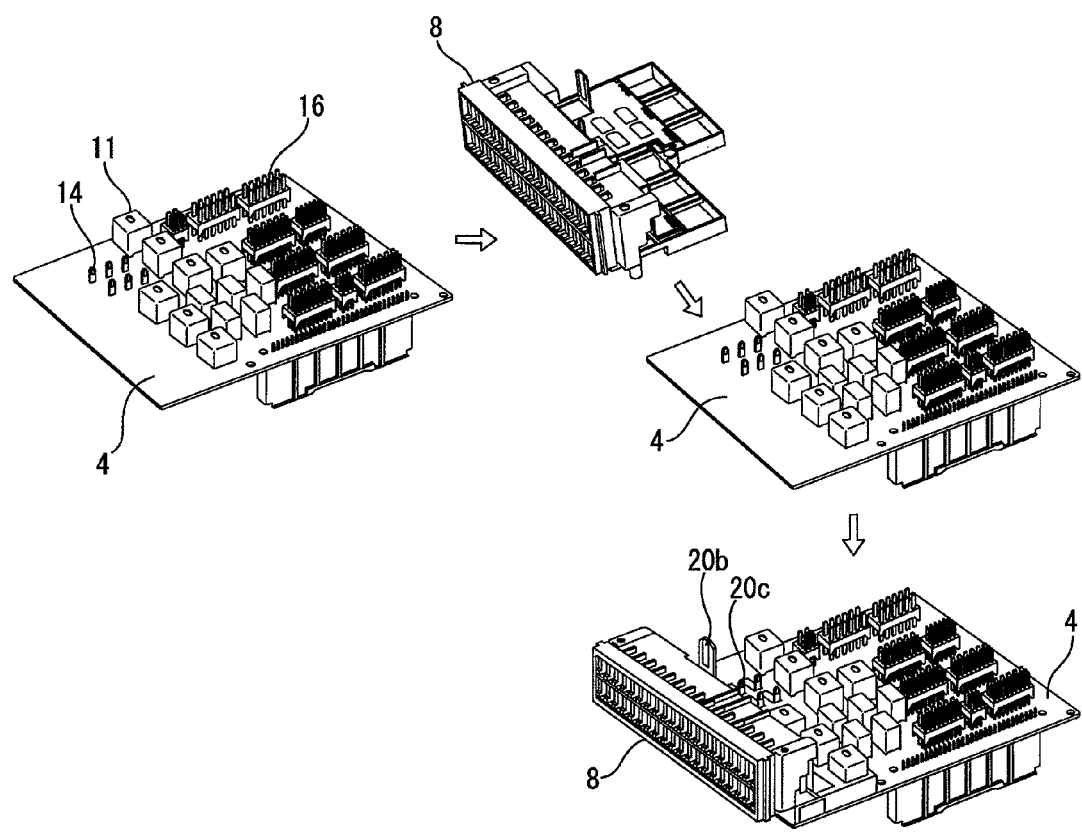

ELECTRICAL JUNCTION BOX

The present application claims priority under 35 U.S.C. §119 of Japanese Application No. 2009-029286, filed on Feb. 12, 2009, the disclosure of which is expressly incorporated by reference herein in its entirety.

TECHNICAL FIELD

This invention relates to an electrical junction box and more particularly relates to an electrical junction box that is mounted on a motor vehicle and can suppress heat generation in the box.

BACKGROUND ART

In an electrical junction box such as a junction box to be mounted on a motor vehicle, internal circuit members such as bus bars and a printed board are contained at a high density on account of rapid increase of electrical and electronic components. Relays and electronic components are mounted on the printed board.

For example, JP 2006-187052 A (Patent Document 1) discloses an electrical junction box in which a number of relays are mounted on a printed board contained in a casing and an electrical power source bus bar is directly connected to the relays.

PRIOR TECHNICAL DOCUMENT

Patent Document

[Patent Document 1] JP 2006-187052 A

DISCLOSURE OF THE INVENTION

Problems that the Invention is to Solve

As disclosed in Patent Document 1, in the case where the bus bar, in which a great amount of electrical current flows, is directly connected to terminals of the relays, it is possible to reduce a resistance in the connected portions. However, the bus bar connected to the electrical power source is likely to generate a high temperature on account of direct connection. In this case, since there is no space for radiating a heat generated in the bus bar, a local high temperature is likely to generate around the bus bar in the electrical junction box. Accordingly, it is necessary to provide the electrical junction box with means for radiating the heat in the bus bar. This will raise a problem that the electrical junction box will be upsized.

In the case where the bus bar and relays are welded to one another on the printed board, it is necessary to prepare welding equipments. In addition, it is necessary to carry out a welding step. This will cause a cost increase in production due to equipment costs and working steps.

In view of the above problems, an object of the present invention is to provide an electrical junction box in which a heat generated in a bus bar is dispersed to uniform the heat in the box and to suppress a high temperature in the local bus bar, thereby requiring no means for radiating the bus bar, downsizing and cost-cutting of the electrical junction box.

Means for Solving the Problems

In order to achieve the above object, an electrical junction box comprises a casing, a printed board contained in the casing, an insulation plate disposed on the printed board, a bus bar mounted on the insulation plate, and a relay mounted on the printed board. The bus bar is provided with an electrical power source terminal to be connected to an electrical power source side. Branched portions provided on the bus bar are connected to a conductor on the printed board, respectively. A terminal of the relay is connected to the printed board conductor connected to the branched portions of the bus bar. The relay terminal is connected through the printed board conductor to the bus bar.

Thus, according to the present invention, the terminal of the relay is connected to the bus bar through the conductor on the printed board connected to the branched portions of the bus bar without directly connecting the relay terminal to the bus bar connected to the electrical power source.

Consequently, the electrical current flows and disperses from the electrical power source side of the bus bar to a plurality of conductors on the printed board. This will uniformly disperse the heat generated in the bus bar onto the conductors, thereby suppressing a high temperature around the local bus bar. Accordingly, it is not necessary to provide means for radiating the bus bar and it is possible to downsize the electrical junction box.

Since the bus bar terminal and relay terminal are inserted into and soldered to the terminal apertures in the conductor on the printed board, it is possible to solder the terminals together with the other terminals and electrical components mounted on the printed board. Thus, since the bus bar terminal is not welded to the relay terminal directly, it is not necessary to prepare the welding equipments as disclosed in Patent Document 1, it is possible to require no welding work and to reduce a cost.

Preferably, the conductor on the printed board disposed between the bus bar and the relay is formed into a portion thick enough to increase an allowable electrical current. This will enhance a more uniform heat effect.

Preferably, the bus bar terminal connected through the printed board to the relay is disposed near the relay. Thus, it is possible to shorten the conductors that couple the relay terminals to the bus bar terminals, thereby facilitating an arrangement of circuits.

Effects of the Invention

As described above, according to the present invention, since the bus bar attached to the printed board and the relay disposed on the printed board are connected through the conductors on the printed board to each other, it is possible to disperse the heat generated in the bus bar onto the conductors on the printed board, to suppress the high temperature, and to uniform the temperature in the electrical junction box. Accordingly, it is not necessary to provide means for radiating the bus bar, and it is possible to downsize the electrical junction box to reduce a cost in production.

BRIEF EXPLANATION OF THE DRAWINGS

FIG. 4A is a perspective view of a fuse module. FIG. 4B is an exploded perspective view of the fuse module shown in FIG. 4A.

FIG. 5 is a perspective view of the electrical junction box in accordance with the present invention, illustrating a process of assembling the electrical junction box.

PREFERRED ASPECTS OF EMBODYING THE INVENTION

Figure 1:
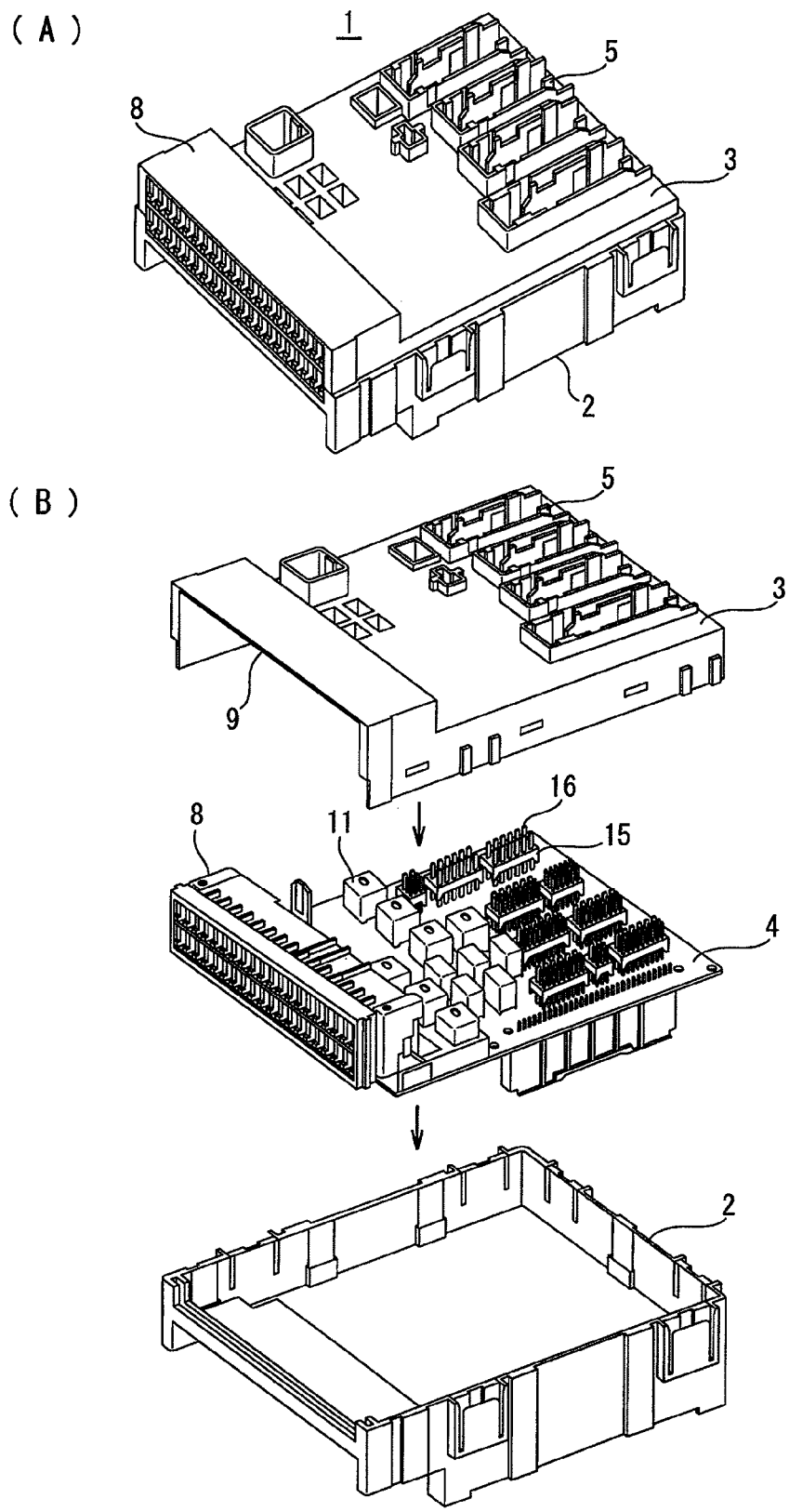
FIG. 1A is a perspective view of an embodiment of an electrical junction box in accordance with the present invention.
FIG. 1B is an exploded perspective view of the electrical junction box shown in FIG. 1A.

Referring now to the drawings, an embodiment of an electrical junction box in accordance with the present invention will be described below.

An electrical junction box in the embodiment of the present invention is a junction box that is mounted on a motor vehicle.

As shown in FIGS. 1A and 1B, an electrical junction box 1 includes a lower casing member 2, an upper casing member 3, and an internal circuit member having a printed board 4 and contained between the casing members 2 and 3. The upper casing member 3 is provided on an upper wall with connector containing sections 5. A fuse module 8 is mounted on one end side of the printed board 4. The fuse module 8 is disposed in a side opening 9 formed between the lower casing member 2 and the upper casing member 3. Fuses are inserted through the side opening 9 into the fuse module 8.

Figure 2:
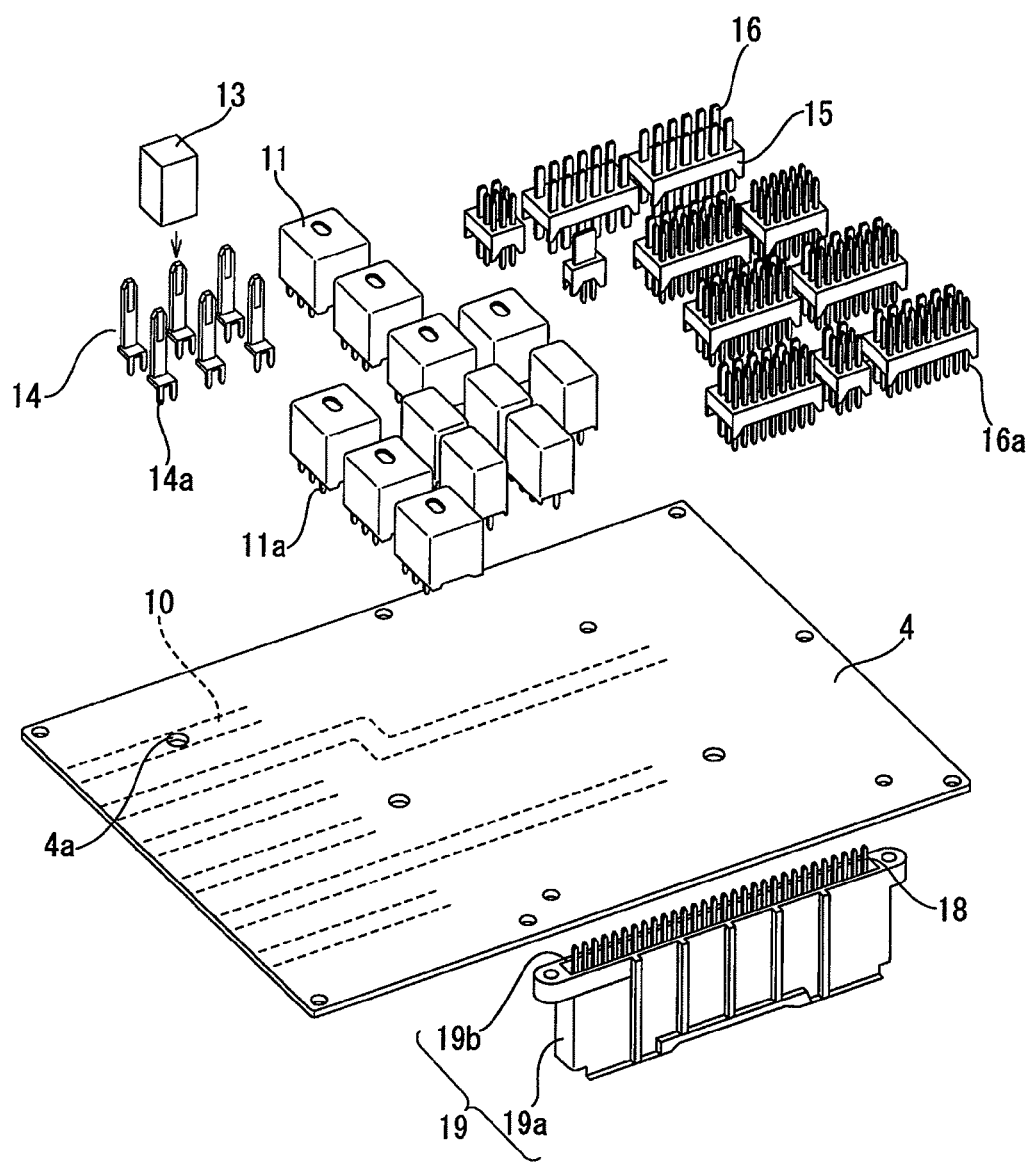
FIG. 2 is an exploded perspective view of a main part of the electrical junction box, illustrating electrical components such as relays and connectors to be mounted on a printed board.

As shown in FIG. 2, the printed board 4 is formed into a multi-layer thick copper board in which thick conductors 10 (70 μm in thickness in the present embodiment) are laminated on four layers.

Relays 11 to be connected to the conductors 10, FL terminals 14 to be connected to fusible links 13, and connector connecting terminals 16 supported on connector tables 15 are disposed on a front side of the printed board 4. Conductor connecting terminals 11a, 14a, and 16a provided on lower ends of the relays 11, FL terminals 14, and connector connecting terminals 16 are inserted into terminal apertures 4a provided in the conductors 10 on the printed board 4 and soldered to the conductors 10.

The printed board 4 is also provided on a rear side with connector connecting terminals 18. The connector connecting terminals 18 are previously inserted into and fixed to a connector housing 19 that includes a peripheral wall 19a, which receives a connector connected to an ECU, and a terminal support table portion 19b. The conductor connecting terminals provided on upper ends of the connector connecting terminals 18 are inserted into the terminal apertures 4a in the printed board 4 and soldered to the conductors 10.

As shown in FIGS. 4A and 4B, the fuse module 8 has an input side bus bar 20 disposed on an insulation plate 7. A single electrical power source input terminal 20b to be connected to a terminal (not shown) connected to a distal end of an electrical power source line, and a plurality of input terminals 20c to be connected to input terminals of the fusible link 13 project from a base plate portion 20a of the input side bus bar 20. The input side bus bar 20 is provided on a distal end of the base plate portion 20a with an L-shaped bent portion 20d. A horizontal portion 20e extending horizontally from the bent portion 20d is provided on a distal end with a plurality of tuning fork type terminals 20f. The bent portion 20d of the base plate portion 20a is provided on an opposite side with a plurality of branched portions 20g bent downward to be connected to the conductors of the printed board 4.

As shown in FIG. 4B, a plurality of output side bus bars 21 provided with the tuning fork type terminals are attached to the fuse module 8 below the input side bus bar 20. Furthermore, a plurality of input side bus bars 22 and output side bus bars 23 provided with the tuning fork type terminals are attached to the fuse module 8 below the output side bus bars 21.

These bus bars 21 to 23 are positioned by a fuse table 8a of the fuse module 8 and are supported on the insulation plate 7. A fuse casing 8b is attached to a front side of the fuse table 8a.

Figure 3:
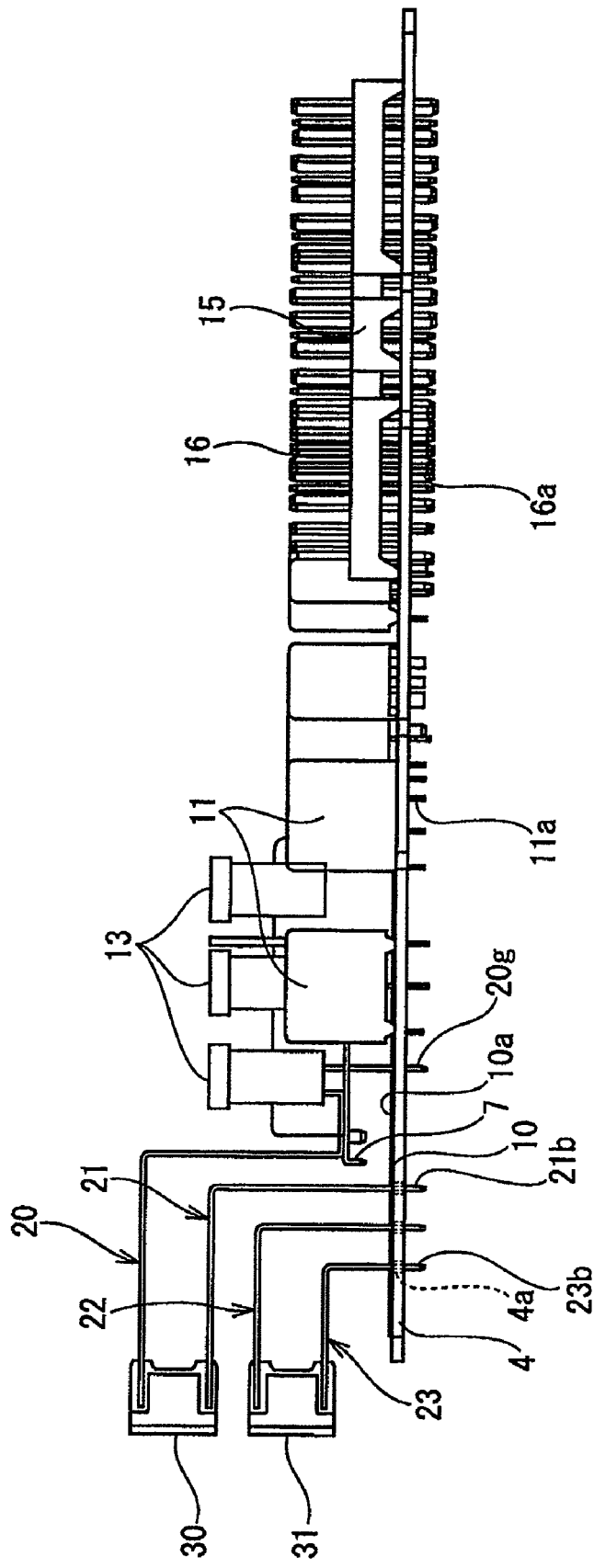
FIG. 3 is a longitudinal section view of the main part of the electrical junction box, illustrating the printed board on which bus bars, relays, and connectors are mounted.

As shown in FIG. 3, input terminals of a fuse 30 to be inserted into an upper layer are connected to the tuning fork type terminals of the bus bar 20. Also, input terminals of a fuse 31 to be inserted into a lower layer are connected to the tuning fork type terminal of the input side bus bar 22. The fuse 31 is connected to the tuning fork type terminals of the output side bus bar 23.

The input side bus bar 20 is disposed on the upper layer in the fuse module 8 and the input side bus bar 22 is disposed on the lower layer in the fuse module 8. The input side bus bar 20 is connected to the fusible links 13 and the FL terminals 14 of the fusible links 13 are connected to the conductors 10 on the printed board 4.

The respective output side bus bars 21 and 23 are provided on vertical portions with conductor connecting terminals 21b and 23b. The conductor connecting terminals 21b and 23b are connected to the conductors 10 on the printed board 4.

Thus, the branched portions 20g, which are branched from the input side bus bar 20 to be connected to the electrical power source, are connected to the conductors 10 on the printed board 4.

The input side bus bar 20 to be directly connected to the electrical power source line is connected to the conductors 10 on the printed board 4. The conductors 10 are connected to input side terminals of the relays 11. Output side terminals of the relays 11 are connected to the conductors 10 of the printed board 4. The conductors 10 are connected to terminals of connectors and fuses mounted on the printed board 4.

As shown in FIG. 1B, the relays 11 are disposed on the printed board 4 near the side on which the fuse module 8 is mounted. The connector connecting terminals 16 are disposed at a side opposite from the fuse module 8 on the printed board 4.

The electrical junction box 1 shown in FIG. 3 is assembled by the process shown in FIG. 5. The conductor connecting terminals of the connector connecting terminals 16, relays 11, and FL terminals 14 are previously inserted into the terminal apertures 4a in the printed board 4.

Next, the fuse module 8, on which the bus bars 20 to 23 are mounted, is attached to a side portion of the printed board 4. The conductor connecting terminals of the bus bars 20 to 23 of the fuse module 8 are inserted into the terminal apertures 4a in the printed board 4.

The fusible links 13 are fitted in terminals 20c of the bus bar 20 and the FL terminal 14.

Thereafter, the conductor connecting terminals of the bus bars 20 to 23, the FL terminals 14, and the conductor connecting terminals of connector connecting terminals 16 are soldered together on the conductors 10 on the printed board 4. Then, the printed board 4 is turned upside down and the connector connecting terminals 18 are inserted into and soldered to the terminal apertures 4a.

Finally, the integrated printed board 4 is assembled between the lower casing member 2 and the upper casing member 3 to complete the electrical junction box 1.

As described above, in the embodiment of the electrical junction box 1, the bus bars 20 to 23 are connected through the conductors 10 on the printed board 4 to the relays 11 mounted on the printed board 4 without directly connecting the bus bars 20 to 23 to the relays 11.

The heat generated in the bus bar 20 connected to the electrical power source line is transmitted to the conductors 10 on the printed board 4 and is radiated uniformly without causing a high temperature at a local position. Consequently, the heat is uniformed at the side of mounting the fuse module 8 and relays 11 in the electrical junction box 1, thereby requiring no means for radiating the heat in the bus bar 20.

What is claimed is:

1. An electrical junction box comprising:
   a casing;
   a printed board contained in said casing;
   an insulation plate disposed on said printed board; a bus bar mounted on said insulation plate; and
   a relay mounted on said printed board;
   said bus bar including an electrical power source terminal configured to be connected to an electrical power source side, and branched portions respectively connected to a conductor on said printed board,
   wherein a terminal of said relay is soldered and connected to the conductor on said printed board, and said terminal of said relay is connected through the conductor on said printed board to said bus bar.

2. The electrical junction box according to claim 1, wherein the branched portions of said bus bar which are connected through the conductor on said printed board to said relay are disposed near said relay.

3. The electrical junction box according to claim 1, wherein said bus bar includes a terminal portion connected to a fusible link.

* * * * *